US008854605B2

(12) United States Patent
Minoda

(10) Patent No.: US 8,854,605 B2
(45) Date of Patent: Oct. 7, 2014

(54) ILLUMINATION OPTICAL SYSTEM, EXPOSURE APPARATUS, AND DEVICE FABRICATION METHOD

(75) Inventor: Ken Minoda, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 724 days.

(21) Appl. No.: 12/685,309

(22) Filed: Jan. 11, 2010

(65) Prior Publication Data

US 2010/0208223 A1    Aug. 19, 2010

(30) Foreign Application Priority Data

Feb. 13, 2009  (JP) .................................. 2009-031964

(51) Int. Cl.
*G03B 27/72* (2006.01)
*G03B 27/54* (2006.01)
*G03F 7/20* (2006.01)

(52) U.S. Cl.
CPC ............ *G03B 27/54* (2013.01); *G03F 7/70091* (2013.01); *G03F 7/70191* (2013.01)
USPC .............................................. 355/71; 355/67

(58) Field of Classification Search
USPC .................................. 355/53, 67, 71; 362/322
See application file for complete search history.

(56) References Cited

U.S. PATENT DOCUMENTS

| 6,583,855 | B2 * | 6/2003 | Krikke et al. .................... 355/67 |
| 7,345,741 | B2 | 3/2008 | Shiozawa et al. | |
| 2002/0154284 | A1 * | 10/2002 | Sato ................. 355/71 |
| 2003/0025890 | A1 * | 2/2003 | Nishinaga ....................... 355/53 |
| 2008/0030707 | A1 | 2/2008 | Tanaka et al. | |
| 2008/0094599 | A1 * | 4/2008 | Scheible et al. ................. 355/71 |
| 2008/0143993 | A1 | 6/2008 | Shiozawa et al. | |
| 2008/0259305 | A1 * | 10/2008 | Goto ................................. 355/67 |
| 2008/0259307 | A1 * | 10/2008 | Arai et al. ......................... 355/71 |
| 2009/0323043 | A1 * | 12/2009 | Dieckmann et al. ............ 355/71 |
| 2012/0015306 | A1 * | 1/2012 | Tanaka et al. .................. 430/325 |

FOREIGN PATENT DOCUMENTS

| JP | 2000-082655 A | 3/2000 |
| JP | 2006-019702 A | 1/2006 |
| JP | 2006-059834 A | 3/2006 |
| WO | 2008092653 A2 | 8/2008 |

OTHER PUBLICATIONS

Office Action issued in counterpart Japanese Patent Application 2009-031964 dated Mar. 12, 2013.

* cited by examiner

*Primary Examiner* — Peter B Kim
*Assistant Examiner* — Deoram Persaud
(74) *Attorney, Agent, or Firm* — Rossi, Kimms & McDowell LLP

(57) ABSTRACT

The present invention provides an illumination optical system which illuminates an illumination target surface with a light beam from a light source, the system including a plurality of adjustment units each having one of a reflectance distribution and a transmittance distribution to adjust an incident angle distribution of the light beam which impinges on the illumination target surface, the plurality of adjustment units including an adjustment unit which adjusts differences between light amounts, in a first direction, of incident angle distributions of light beams at a plurality of points on the illumination target surface, and light amounts, in a second direction, thereof, and an adjustment unit which adjusts at least one of light amount differences, in the first direction, of the incident angle distributions of the light beams at the plurality of points on the illumination target surface, and light amount differences, in the second direction, thereof.

8 Claims, 8 Drawing Sheets

ILLUMINATION OPTICAL SYSTEM, EXPOSURE APPARATUS, AND DEVICE FABRICATION METHOD

BACKGROUND OF THE INVENTION

1. Field of the Invention

The present invention relates to an illumination optical system, an exposure apparatus, and a device fabrication method.

2. Description of the Related Art

An exposure apparatus is employed to fabricate a semiconductor device using photolithography. The exposure apparatus illuminates a reticle (mask) with a light beam from an illumination optical system, and projects and transfers a pattern formed on the reticle onto a wafer (substrate) by a projection optical system.

Along with the recent advances in micropatterning of semiconductor devices, it has become indispensable to obtain a uniform illuminance distribution on a wafer in order to precisely transfer a fine pattern onto the wafer. Also, off-axis illumination (modified illumination) in which a reticle is illuminated with a shape optimized for the reticle pattern (for example, an annular shape or a quadrupole shape) is attracting a great deal of attention as one resolution enhanced technology for improving the depth of focus and the resolution of the exposure apparatus. A secondary light source formed by an optical integrator arranged in the illumination optical system serves as a pupil for the illumination target surface. Hence, oblique-incidence illumination can be realized by changing the light intensity distribution on the pupil plane (pupil intensity distribution) of the illumination optical system.

However, if the incident angle distributions (incident angular distributions) on the wafer (respective points on it) as the final illumination target surface have differences (light amount differences) in the horizontal direction (or the vertical direction), a positional shift occurs in a pattern transferred onto the wafer when the wafer is defocused from the focal plane of the projection optical system. As a result, differences (line width differences) occur in the horizontal direction (or the vertical direction) in the line width of a pattern transferred onto the wafer. Similarly, if the incident angle distributions on the wafer have light amount differences between the vertical and horizontal directions, line width differences occur between the vertical and horizontal directions in a pattern transferred onto the wafer. For these reasons, to precisely transfer a fine pattern onto a wafer using oblique-incidence illumination, it is necessary not only to adjust the light intensity distribution on the pupil plane of the illumination optical system into a desired shape, but also to make the incident angle distributions on the wafer as the illumination target surface uniform free from any image height differences.

To meet these requirements, Japanese Patent Laid-Open No. 2006-059834 proposes a technique of adjusting the incident angle distributions on the wafer by inserting an adjustment unit such as a filter having a predetermined reflectance distribution or transmittance distribution in the illumination optical system.

However, the prior art does not take account of the adverse effect of light (flare light) reflected by the adjustment unit such as a filter. Therefore, regions adjacent to the predetermined exposure region are exposed by the flare light reflected by the adjustment unit, resulting in deterioration in line width uniformity of a pattern transferred onto the wafer. Furthermore, because the prior art adjusts the incident angle distributions on the wafer by inserting one adjustment unit in the illumination optical system, it cannot adjust the incident angle distributions on the wafer with a sufficiently high accuracy for patterns rapidly becoming finer.

SUMMARY OF THE INVENTION

The present invention provides a technique which can suppress generation of any flare light and accurately (i.e., uniformly) adjust the incident angle distributions on the illumination target surface.

According to one aspect of the present invention, there is provided an illumination optical system which illuminates an illumination target surface with a light beam from a light source, the system including a plurality of adjustment units each having one of a reflectance distribution and a transmittance distribution to adjust an incident angle distribution of the light beam which impinges on the illumination target surface, the plurality of adjustment units including an adjustment unit configured to adjust differences between light amounts, in a first direction, of incident angle distributions of light beams at a plurality of points on the illumination target surface, and light amounts, in a second direction different from the first direction, thereof, and an adjustment unit configured to adjust at least one of light amount differences, in the first direction, of the incident angle distributions of the light beams at the plurality of points on the illumination target surface, and light amount differences, in the second direction, thereof.

Further features of the present invention will become apparent from the following description of exemplary embodiments with reference to the attached drawings.

DESCRIPTION OF THE EMBODIMENTS

Figure 1:
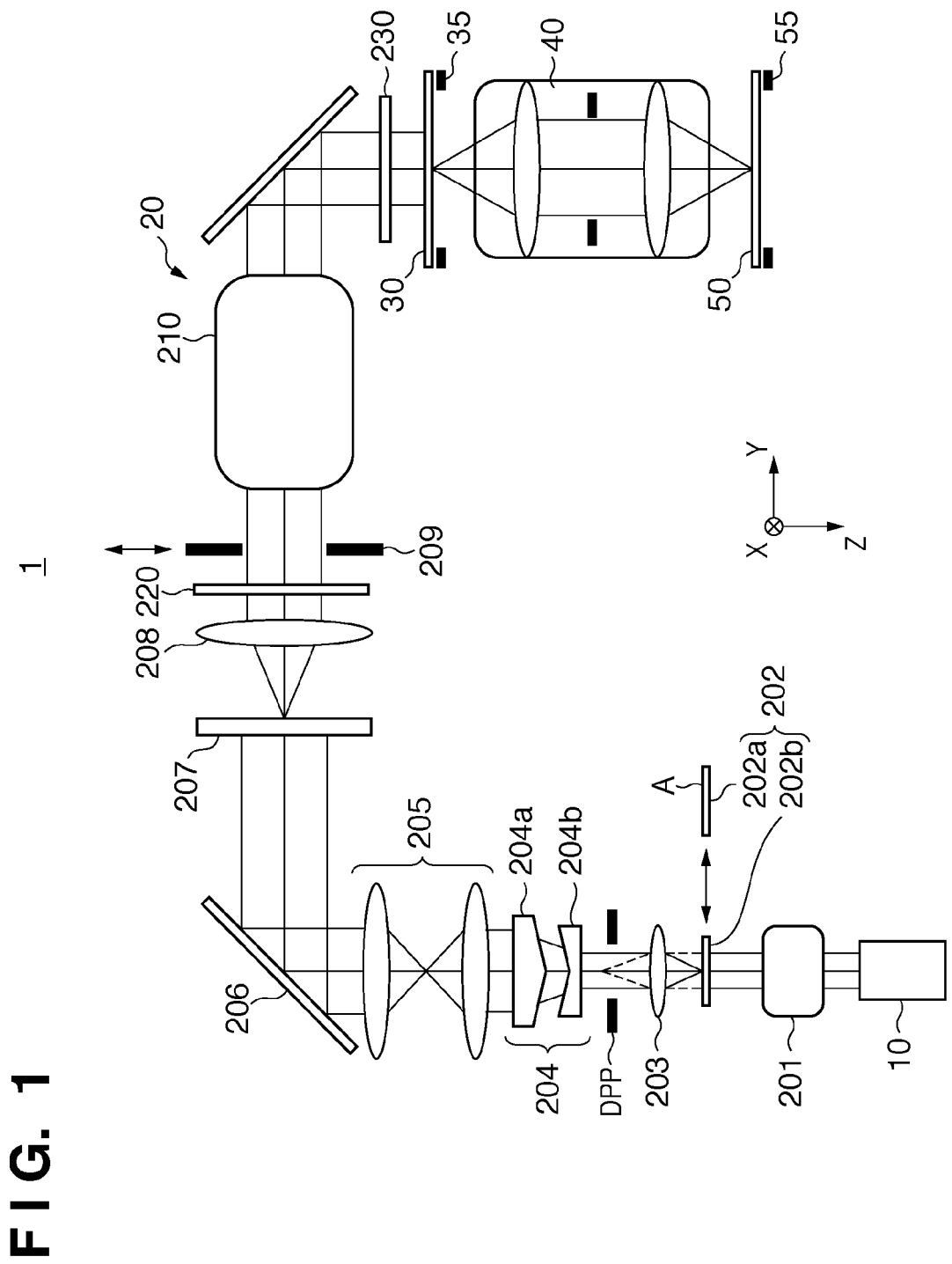
FIG. 1 is a schematic view showing the arrangement of an exposure apparatus according to one aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an exposure apparatus 1 according to one aspect of the present invention. In this embodiment, the exposure apparatus 1 is a projection exposure apparatus which transfers the pattern of a reticle onto a wafer by the step & scan scheme. However, the exposure apparatus 1 can also adopt the step & repeat scheme or another exposure scheme.

As shown FIG. 1, the exposure apparatus 1 includes an illumination optical system 20 which illuminates a reticle 30 with a light beam from a light source 10, a reticle stage 35 which supports the reticle 30, a projection optical system 40, and a wafer stage 55 which supports a wafer 50. Also, in FIG. 1, a direction parallel to the optical axis extending through the reticle 30 or the wafer 50 is defined as the Z-axis direction, and a plane perpendicular to the optical axis is defined as the X-Y plane.

The light source 10 is, for example, a KrF excimer laser having a wavelength of about 248 nm or an ArF excimer laser having a wavelength of about 193 nm. However, the type and number of light sources 10 are not limited.

The illumination optical system 20 illuminates the reticle 30 located on the illumination target surface with a light beam from the light source 10. In this embodiment, the illumination optical system 20 includes a relay optical system 201, diffractive optical element 202, condenser lens 203, prism 204, zoom lens 205, and mirror 206. The illumination optical system 20 also includes an optical integrator 207, condenser lens 208, field stop 209, imaging optical system 210, first adjustment unit 220, and second adjustment unit 230.

The relay optical system 201 converts a light beam from the light source 10 into a nearly collimated light beam having a rectangular cross-section, and guides the collimated light beam to the diffractive optical element 202.

The light beam emerging from the diffractive optical element 202 is converged by the condenser lens 203 to form a diffraction pattern on a diffraction pattern plane DPP. Note that the diffractive optical element 202 includes, for example, a plurality of diffractive optical elements 202a and 202b having different characteristics, and is exchangeably arranged on the optical axis of the illumination optical system 20. Hence, a plurality of diffraction patterns having, for example, an annular shape and multipole shapes can be formed by exchanging the diffractive optical element 202 to be arranged on the optical axis of the illumination optical system 20.

The diffraction pattern formed on the diffraction pattern plane DPP has its size and shape adjusted by the prism 204 and zoom lens 205, and enters the mirror 206. The prism 204 includes a first prism member 204a and second prism member 204b. When the first prism member 204a and second prism member 204b have a sufficiently short distance between them, they can be approximately regarded as one integrated plane-parallel glass plate. When the prism 204 can be approximately regarded as a plane-parallel glass plate, the diffraction pattern formed on the diffraction pattern plane DPP is enlarged or reduced by the zoom lens 205 while holding nearly similar figures, and forms an image on the incident surface of the optical integrator 207. Note that the shape (for example, the width of an annular zone) of the diffraction pattern formed on the diffraction pattern plane DPP can be adjusted by increasing the distance between the first prism member 204a and the second prism member 204b.

The light beam reflected by the mirror 206 enters the optical integrator 207. The optical integrator 207 is a fly-eye lens or a microlens array obtained by two-dimensionally arranging a plurality of microlenses. The incident light beam on the optical integrator 207 is two-dimensionally split to form point sources on the back-side focal planes of the respective microlenses having received the split light beams. Thus, a virtual surface light source (secondary light source) having approximately the same light intensity distribution as that of the incident light beam on the optical integrator 207 is formed on the back-side focal plane of the optical integrator 207.

The light beam emerging from the optical integrator 207 is converged by the condenser lens 208. Note that the secondary light source formed on the back-side focal plane of the optical integrator 207 superposedly illuminates the field stop 209 placed at a position conjugate to the reticle 30 (eventually, the wafer 50) as the illumination target surface.

The field stop 209 has a function of defining an illumination region on the illumination target surface. In this embodiment, the field stop 209 defines an illumination region (exposure region) on the reticle 30 held on the reticle stage 35. The field stop 209 includes, for example, a plurality of light-shielding plates and so can form an aperture shape corresponding to the illumination region by driving the plurality of light-shielding plates.

The imaging optical system 210 forms an image of (projects) the light beam having passed through the field stop 209 (i.e., the light beam having the aperture shape formed by the field stop 209) on the reticle 30.

In this embodiment, a plurality of adjustment units (the first adjustment unit 220 and second adjustment unit 230) having reflectance distributions to adjust the incident angle distributions (incident angular distributions) of light beams which impinge on the illumination target surface are arranged in the illumination optical system 20, as shown in FIG. 1. In this case, the first adjustment unit 220 is located near the preceding stage (light source side) of the field stop 209 (more specifically, the first adjustment unit 220 is arranged between the light source 10 and the field stop 209), and the second adjustment unit 230 is arranged between the field stop 209 and the reticle 30. The first adjustment unit 220 and second adjustment unit 230 will be described in detail later.

The reticle 30 has a circuit pattern and is supported and driven by the reticle stage 35. Diffracted light generated by the reticle 30 is projected onto the wafer 50 via the projection optical system 40. Since the exposure apparatus 1 is of the step & scan scheme, it transfers the pattern of the reticle 30 onto the wafer 50 by scanning them.

The reticle stage 35 supports the reticle 30 and is connected to a driving mechanism (not shown). The driving mechanism (not shown) includes, for example, a linear motor and drives the reticle stage 35 in the X-, Y-, and Z-axis directions and the rotation directions about the respective axes.

The projection optical system 40 projects the pattern of the reticle 30 onto the wafer 50. The projection optical system 40 can be a dioptric system, a catadioptric system, or a catoptric system.

The wafer 50 is a substrate onto which the pattern of the reticle 30 is projected (transferred). However, the wafer 50 can also be substituted by a glass plate or another substrate. The wafer 50 is coated with a resist (photosensitive agent).

The wafer stage 55 supports and drives the wafer 50 in the X-, Y-, and Z-axis directions and the rotation directions about the respective axes using a linear motor, like the reticle stage 35.

Figure 2:
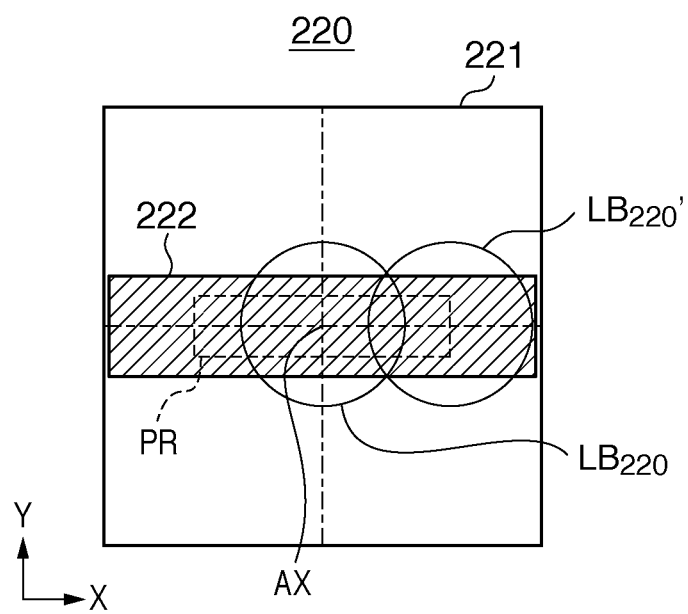
FIG. 2 is a view illustrating an example of the arrangement of a first adjustment unit of the exposure apparatus shown in FIG. 1.
Figure 3:
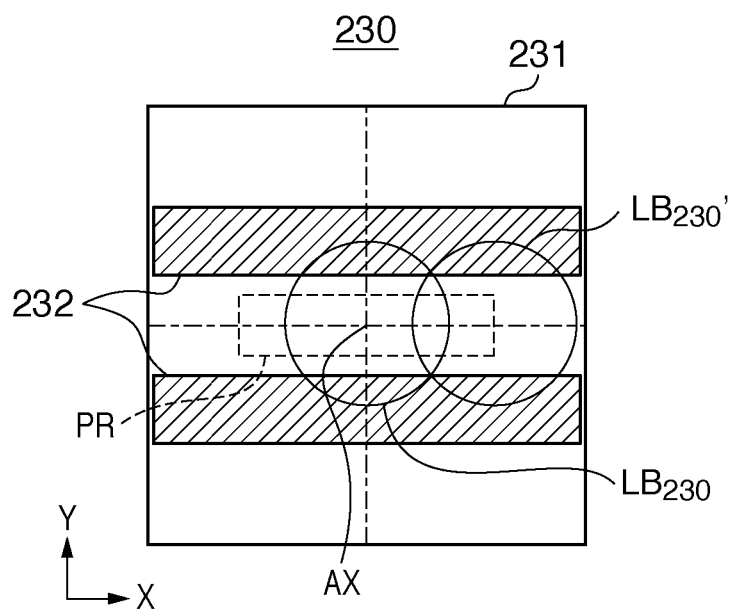
FIG. 3 is a view illustrating an example of the arrangement of a second adjustment unit of the exposure apparatus shown in FIG. 1.

The first adjustment unit 220 and second adjustment unit 230 will be explained in detail below. FIG. 2 is a view illustrating an example of the arrangement of the first adjustment unit 220. FIG. 3 is a view illustrating an example of the arrangement of the second adjustment unit 230. FIGS. 2 and 3 show the first adjustment unit 220 and second adjustment unit 230, respectively, when viewed from the optical axis direction of the illumination optical system 20. Note that in this embodiment, the field stop 209 defines a slit-like illumination region, and a region PR indicated by broken lines in FIGS. 2 and 3 is that through which a principal ray passes. The principal ray means herein a light beam which passes through the center of the pupil plane of the illumination optical system 20.

The first adjustment unit 220 includes a plane-parallel plate 221 and an adjustment coating 222 having its reflectance (or its transmittance) which varies depending on the incident position of a light beam, as shown in FIG. 2. For example, the adjustment coating 222 is formed on the optical surface of the plane-parallel plate 221 on its light source side, and has its thickness controlled for each position on the plane-parallel plate 221 in the X- and Y-axis directions to form a predetermined reflectance distribution (or a predetermined transmittance distribution) which changes continuously. Also, in a region other than that where the adjustment coating 222 is formed on the plane-parallel plate 221, an antireflection coating optimized for the wavelength and incident angle of a light beam from the light source 10 is formed to suppress unwanted reflection by the first adjustment unit 220.

The second adjustment unit 230 has the same arrangement as the first adjustment unit 220. More specifically, the second adjustment unit 230 includes a plane-parallel plate 231 and an adjustment coating 232 having its reflectance (or its transmittance) which varies depending on the incident position of a light beam, as shown in FIG. 3. For example, the adjustment coating 232 is formed on the optical surface of the plane-parallel plate 231 on its light source side, and has its thickness controlled for each position on the plane-parallel plate 231 in the X- and Y-axis directions to form a predetermined reflectance distribution (or a predetermined transmittance distribution) which changes continuously. Also, in a region other than that where the adjustment coating 232 is formed on the plane-parallel plate 231, an antireflection coating optimized for the wavelength and incident angle of a light beam from the light source 10 is formed to suppress unwanted reflection by the second adjustment unit 230. Note that the adjustment coating 222 of the first adjustment unit 220 and the adjustment coating 232 of the second adjustment unit 230 are formed at positions different with respect to an optical axis AX of the illumination optical system 20 (i.e., in regions having different distances from the optical axis AX of the illumination optical system 20).

Referring to FIGS. 2 and 3, reference symbols $LB_{220}$ and $LB_{230}$ denote the divergences, of a light beam (on-axis light beam) which reaches an on-axis position on the illumination target surface, on the first adjustment unit 220 and second adjustment unit 230, respectively. In other words, reference symbols $LB_{220}$ and $LB_{230}$ denote the pupil divergences, at an on-axis position on the illumination target surface, on the first adjustment unit 220 and second adjustment unit 230, respectively. Also, reference symbols $LB_{220}'$ and $LB_{230}'$ denote the divergences, of a light beam (off-axis light beam) which reaches an off-axis position (a position shifted from the optical axis in the X-axis direction) on the illumination target surface, on the first adjustment unit 220 and second adjustment unit 230, respectively. In other words, reference symbols $LB_{220}'$ and $LB_{230}'$ denote the pupil divergences, at an off-axis position on the illumination target surface, on the first adjustment unit 220 and second adjustment unit 230, respectively. Hence, the incident angle distributions at respective points on the illumination target surface can be adjusted by superposing predetermined reflectance distributions (or predetermined transmittance distributions) on the pupil divergences corresponding to respective points on the first adjustment unit 220 and second adjustment unit 230.

Figure 4:
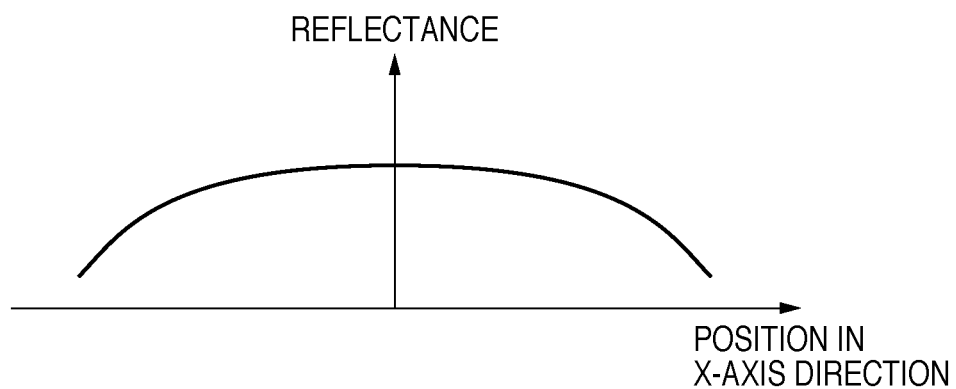
FIG. 4 is a graph illustrating an example of a reflectance distribution formed by an adjustment coating of the first adjustment unit shown in FIG. 2.

In this embodiment, the adjustment coating 222 of the first adjustment unit 220 forms a reflectance distribution (transmittance distribution) to adjust the light amount differences in the horizontal direction between the incident angle distributions of light beams which impinge on the illumination target surface (the reticle 30 or the wafer 50). That is, the first adjustment unit 220 adjusts the light amount differences in the horizontal direction between the incident angle distributions of light beams at a plurality of points on the illumination target surface. More specifically, the adjustment coating 222 of the first adjustment unit 220 has a convex reflectance distribution in which the reflectance is highest (the transmittance is lowest) at the center of the effective region and monotonically decreases from the center toward the periphery in the X-axis direction, as shown in FIG. 4. When the reflectance (transmittance) differs between the left and right regions within the divergence $LB_{220}'$ by, for example, 5%, the light amount differences in the horizontal direction between the incident angle distributions at an outermost off-axis position on the X-axis can be adjusted by 5%. The first adjustment unit 220 can also form a reflectance distribution (transmittance distribution) to adjust the light amount differences in the vertical direction between the incident angle distributions of light beams which impinge on the illumination target surface. That is, the first adjustment unit 220 has the adjustment coating 222 which forms a reflectance distribution (transmittance distribution) to adjust at least one of the light amount differences in a first direction between the incident angle distributions of light beams which impinge on the illumination target surface and those in a second direction perpendicular to the first direction. Note that FIG. 4 is a graph illustrating an example of a reflectance distribution formed by the adjustment coating 222 of the first adjustment unit 220.

Figure 5:
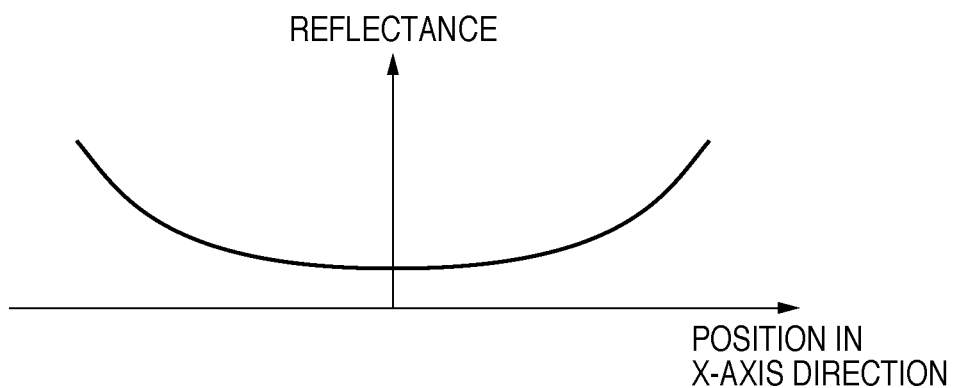
FIG. 5 is a graph illustrating an example of a reflectance distribution formed by an adjustment coating of the second adjustment unit shown in FIG. 3.

Also, in this embodiment, the adjustment coating 232 of the second adjustment unit 230 forms a reflectance distribution (transmittance distribution) to adjust the light amount differences in the two-dimensional directions between the incident angle distributions of light beams which impinge on the illumination target surface (the reticle 30 or the wafer 50). More specifically, the adjustment coating 232 of the second adjustment unit 230 has, at a position far from the optical axis AX of the illumination optical system 20, a concave reflectance distribution in which the reflectance is lowest on the Y-axis and monotonically increases from the Y-axis toward the periphery in the X-axis direction, as shown in FIG. 5. When the reflectance (transmittance) differs between the upper/lower regions and the left/right regions within the divergence $LB_{230}'$ by, for example, 5%, the light amount differences in the two-dimensional directions between the incident angle distributions at an off-axis position can be adjusted by 5%. That is, the second adjustment unit 230 has the adjustment coating 232 which forms a reflectance distribution (transmittance distribution) to adjust the differences between the values indicating the light amounts, in a first direction, of the incident angle distributions of light beams which impinge on the illumination target surface, and those indicating their light amounts in a second direction perpendicular to the first direction. Note that FIG. 5 is a graph illustrating an example of a reflectance distribution formed by the adjustment coating 232 of the second adjustment unit 230.

In this manner, the incident angle distributions of light beams which impinge on the illumination target surface can be accurately (i.e., uniformly) adjusted by imparting a function of adjusting the symmetries of the incident angle distributions in different directions to the first adjustment unit 220 and second adjustment unit 230 each. It is also possible to reduce the time and cost required to adjust the illumination optical system 20 (i.e., adjust the incident angle distributions of light beams which impinge on the illumination target surface).

When the adjustment amounts (correction amounts) of the incident angle distributions differ among individual apparatuses, it takes much time to complete adjustment of the illumination optical system 20 if one adjustment unit is designed and manufactured for each apparatus. In this case, it is only necessary to provide a plurality of adjustment units which have different adjustment amounts (which adjust asymmetries in different directions).

For example, a case in which one adjustment unit is used for adjustment in steps of 2% when the adjustment amount for the light amount differences in the horizontal direction between the incident angle distributions and that for the light amount differences in the two-dimensional directions between the incident angle distributions fall within the range of −4% to +4% will be considered. In this case, to adjust the light amount differences in the horizontal direction between the incident angle distributions and those in the two-dimensional directions between the incident angle distributions at once, not only five adjustment amounts to adjust the light amount differences in the horizontal direction but also five adjustment amounts to adjust the light amount differences in the two-dimensional directions are necessary. Accordingly, 25 types of adjustment units need to be provided in correspondence with five adjustment amounts to adjust the light amount differences in the horizontal direction and five adjustment amounts to adjust the light amount differences in the two-dimensional directions. In other words, it is necessary to provide adjustment units in a number equal to the product between the number of adjustment amounts to adjust the light amount differences in the horizontal direction and that of adjustment amounts to adjust the light amount differences in the two-dimensional directions.

In contrast, as in this embodiment, a case in which the first adjustment unit 220 and second adjustment unit 230 are used to independently adjust the light amount differences in the horizontal direction between the incident angle distributions and those in the two-dimensional directions will be considered. In this case, it is only necessary to provide five types of adjustment units (first adjustment units 220) which adjust the light amount differences in the horizontal direction in steps of 2%, and five types of adjustment units (second adjustment units 230) which adjust the light amount differences in the two-dimensional directions in steps of 2%. In other words, it is only necessary to provide adjustment units in a number equal to the sum of the number of adjustment amounts to adjust the light amount differences in the horizontal direction and that of adjustment amounts to adjust the light amount differences in the two-dimensional directions.

Hence, the time and cost required to adjust the incident angle distributions of light beams which impinge on the illumination target surface can be reduced by independently adjusting, by a plurality of adjustment units, the incident angle distributions, in different directions, of the light beams which impinge on the illumination target surface. This, in turn, makes it possible to shorten the time until an apparatus is shipped, and shorten the adjustment time when, for example, the incident angle distributions have changed with time.

Note that, when the first adjustment unit 220 and second adjustment unit 230 having predetermined reflectance distributions (transmittance distributions) are arranged in the illumination optical system 20, the illuminance distribution on the illumination target surface may change. To combat this situation, an illuminance distribution adjustment mechanism which adjusts the illuminance distribution on the illumination target surface need only be additionally arranged in the illumination optical system 20. The illuminance distribution adjustment mechanism can nearly uniformly adjust the illuminance distribution on the illumination target surface, including the amounts of change attributed to the first adjustment unit 220 and second adjustment unit 230. The detailed arrangement of the illuminance distribution adjustment mechanism is disclosed in, for example, Japanese Patent Laid-Open No. 2000-82655, and a detailed description thereof will not be given herein.

Note also that, because the first adjustment unit 220 and second adjustment unit 230 have predetermined reflectance distributions (transmittance distributions), the light beams reflected by the first adjustment unit 220 and second adjustment unit 230 may impinge on the illumination target surface as flare light (unwanted light), resulting in deterioration in line width uniformity.

Figure 6A:
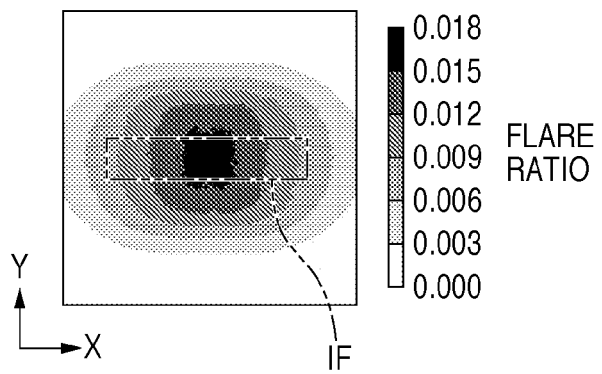
FIGS. 6A to 6D are charts showing the illuminance distributions, on the illumination target surface, of light beams reflected by both the illumination target surface and the adjustment coating of the first adjustment unit or that of the second adjustment unit.
Figure 6B:
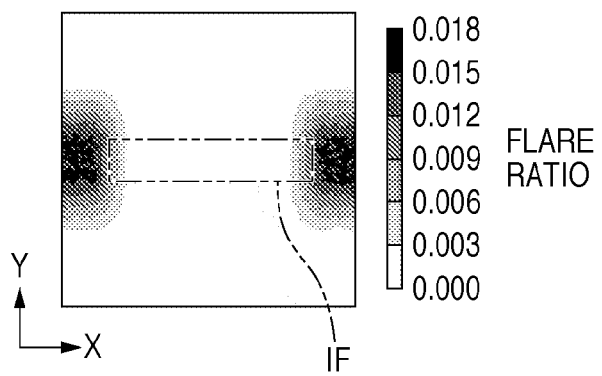
Figure 6C:
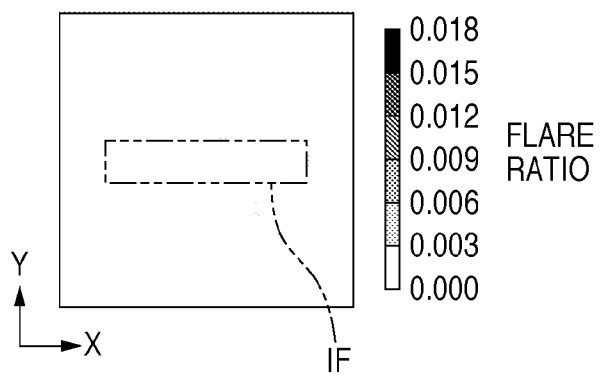
Figure 6D:
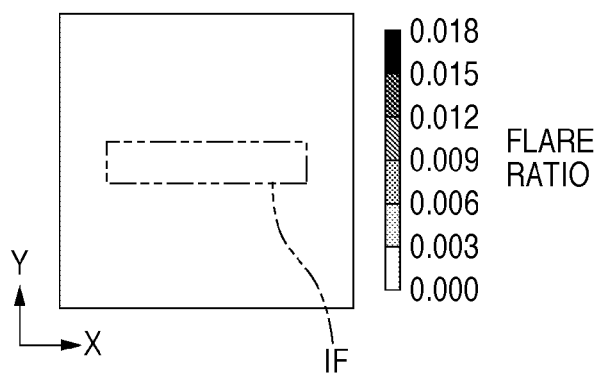
Figure 7A:
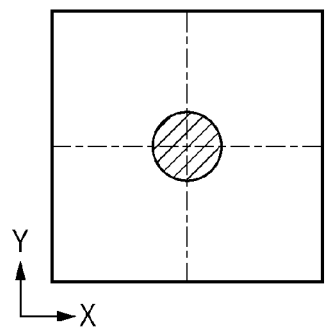
FIGS. 7A and 7B are views showing light intensity distributions (effective light sources) formed on the pupil plane of an illumination optical system in order to illuminate the illumination target surface.
Figure 7B:
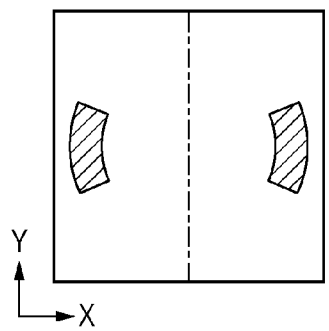

Since the reticle 30 located on the illumination target surface has a pattern formed from a metal such as chromium (Cr), most of illumination light is reflected by the reticle 30. FIGS. 6A and 6B are charts showing the illuminance distributions, on the illumination target surface, of light beams (flare light beams) reflected by both the illumination target surface and the adjustment coating 222 of the first adjustment unit 220. Also, FIGS. 6C and 6D are charts showing the illuminance distributions, on the illumination target surface, of light beams reflected by both the illumination target surface and the adjustment coating 232 of the second adjustment unit 230. FIGS. 6A and 6C show the illuminance distributions, on the illumination target surface, of light beams reflected by both the illumination target surface and the adjustment coating 222 or 232 when the illumination target surface is illuminated with a light intensity distribution (effective light source) having a circular shape smaller than the pupil plane of the illumination optical system 20 as shown in FIG. 7A. Also, FIGS. 6B and 6D show the illuminance distributions, on the illumination target surface, of light beams reflected by both the illumination target surface and the adjustment coating 222 or 232 when the illumination target surface is illuminated with a light intensity distribution (effective light source) having a shape, in which two poles are juxtaposed in the X-axis direction, as shown in FIG. 7B. In FIGS. 6A to 6D, reference symbol IF denotes an illumination region defined by the field stop 209. The illuminance values shown in FIGS. 6A to 6D are obtained by normalization assuming that the illuminance at an on-axis position on the illumination target surface when the first adjustment unit 220 and second adjustment unit 230 are not arranged in the illumination optical system 20 is 1. Note that, since the reflectance of chromium, used to form a pattern of the reticle 30, for an ArF excimer laser or a KrF excimer laser is a little under 40%, the reflectance of the illumination target surface is approximately assumed to be 40% herein. Also, the maximum values of the reflectances of the adjustment coating 222 of the first adjustment unit 220 and the adjustment coating 232 of the second adjustment unit 230 are assumed to be 4%, and the reflectance in a region where the adjustment coating 222 or 232 is not formed in the first adjustment unit 220 or second adjustment unit 230 is assumed to be 0%.

The second adjustment unit 230 has the adjustment coating 232 which is not formed in the region PR through which a principal ray passes. Hence, neither the illumination target surface nor the adjustment coating 232 causes reflection or reflected light (flare light) passes through a region that falls outside the effective diameter (aperture) of each optical element, so no reflected light impinges on the illumination target surface, as shown in FIGS. 6C and 6D.

In contrast, the first adjustment unit 220 has the adjustment coating 222 formed in the region PR through which a principal ray passes. Accordingly, as shown in FIGS. 6A and 6B, light (flare light) reflected by the first adjustment unit 220 impinges on the illumination target surface, so the illuminance distribution on the illumination target surface naturally changes. A change in illuminance distribution within the illumination region IF can be adjusted (corrected) by the above-mentioned illuminance distribution adjustment mechanism. However, a change in illuminance distribution in a region that is adjacent to and falls outside the illumination region IF cannot be adjusted (corrected), so the illuminance distribution in the peripheral portion of the adjacent region naturally changes. As a result, the pattern of the reticle 30 cannot be precisely transferred onto the wafer 50 at a desired line width. For example, a region adjacent to the illumination region IF is illuminated by a surplus of about 1.5% in FIG. 6A, and that region is illuminated by a surplus of about 1.6% in FIG. 6B.

In fact, however, the field stop 209 shields a light beam which enters a region that falls outside the illumination region IF because the first adjustment unit 220 is set closer to the light source 10 than the field stop 209 in this embodiment. In other words, because no light (flare light) reflected by the first adjustment unit 220 impinges on the illumination target surface, it does not change the illuminance distribution in a region adjacent to the illumination region IF.

Note that, when the first adjustment unit 220 is set closer to the illumination target surface than the field stop 209, light (flare light) reflected by the first adjustment unit 220 also enters a region adjacent to the illumination region IF defined by the field stop 209 (adjacent flare). Accordingly, the illuminance distribution in a region adjacent to the illumination region IF naturally changes, resulting in deterioration in line width uniformity of a pattern transferred onto the wafer 50.

For example, assume that an isolated line pattern having a line width of 45 nm is transferred onto the wafer 50. In this case, as the illuminance changes by 0.4%, the line width of the isolated line pattern transferred onto the wafer 50 changes by about 0.1 nm. To reduce the influence of any adjacent flare, the flare ratio in a region adjacent to a predetermined illumination region is less than 0.4%. Assuming that the maximum reflectance of the illumination target surface is 40%, the flare ratio is 1.6% when the reflectance in the region PR through which a principal ray passes in the adjustment unit is 4%. For this reason, the reflectance in the region PR of the adjustment unit arranged between the field stop 209 and the illumination target surface needs to be less than 1.0%. In addition, an adjustment unit having an adjustment coating whose region PR through which a principal ray passes has a reflectance of 1.0% or more needs to be arranged between the light source 10 and the field stop 209.

In this embodiment, the first adjustment unit 220 whose region PR through which a principal ray passes has a reflectance of 1.0% or more is arranged between the light source 10 and the field stop 209, as described above. Moreover, the region PR, through which a principal ray passes, of the second adjustment unit 230 arranged between the field stop 209 and the illumination target surface has a reflectance of less than 1.0%. Hence, in this embodiment, it is possible to suppress generation of any flare light and accurately (i.e., uniformly) adjust the incident angle distributions on the illumination target surface. As a result, the exposure apparatus 1 can precisely transfer the pattern of the reticle 30 onto the wafer 50 at a desired line width.

Also, in this embodiment, the imaging optical system 210 is arranged between the first adjustment unit 220 and the second adjustment unit 230. This is to prevent generation of any interference fringes attributed to reflected light, which are formed between the first adjustment unit 220 and the second adjustment unit 230, by arranging the first adjustment unit 220 and the second adjustment unit 230 with a spacing between them.

Figure 8:
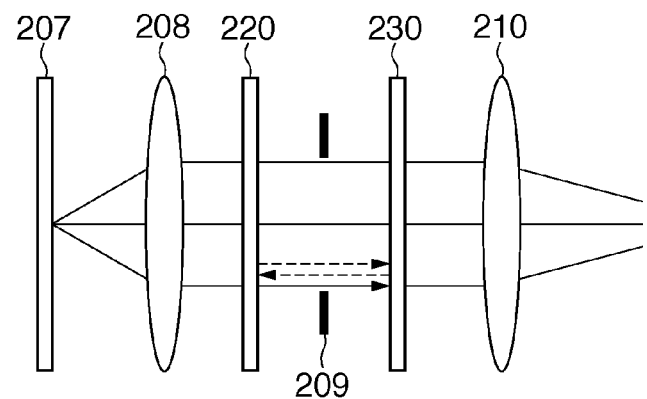
FIG. 8 is a schematic view showing a case in which the first adjustment unit and second adjustment unit are arranged via a field stop in the exposure apparatus shown in FIG. 1.

A case in which the first adjustment unit 220 and second adjustment unit 230 are arranged adjacent to each other, as shown in FIG. 8, will be considered herein. FIG. 8 is a schematic view showing a case in which the first adjustment unit 220 and second adjustment unit 230 are arranged via the field stop 209.

Most of light beams emitted by the light source 10 reach the illumination target surface upon being transmitted through both the first adjustment unit 220 and second adjustment unit 230, but some of them reach the illumination target surface upon being reflected by the first adjustment unit 220 or second adjustment unit 230. If the first adjustment unit 220 and second adjustment unit 230 have a difference in flatness between them or they are tilted with respect to each other, the difference in optical path length between a light beam transmitted through both the first adjustment unit 220 and second adjustment unit 230 and that reflected by the first adjustment unit 220 or second adjustment unit 230 slightly changes for each position. When the difference in optical path length between a light beam transmitted through both the first adjustment unit 220 and second adjustment unit 230 and that reflected by the first adjustment unit 220 or second adjustment unit 230 slightly changes for each position as in this case, interference fringes are generated on the illuminance target surface due to light interference. Especially when a laser is used as the light source 10, coherency is so high as to readily generate interference fringes. As a result, the illuminance distribution on the illumination target surface suffers nonuniformity. This makes it impossible to illuminate the illumination region with a uniform illuminance distribution, resulting in deterioration in line width uniformity of a pattern transferred onto the wafer 50.

To prevent generation of any interference fringes on the illumination target surface, the difference in optical path length between a light beam transmitted through both the first adjustment unit 220 and second adjustment unit 230 and that which is sequentially reflected by the second adjustment unit 230 and first adjustment unit 220 and is transmitted through the second adjustment unit 230 need only be equal to or larger than a coherence length. The distance between the first adjustment unit 220 and the second adjustment unit 230 is half the difference in optical path length between a light beam transmitted through both the first adjustment unit 220 and second adjustment unit 230 and that which is sequentially reflected by the second adjustment unit 230 and first adjustment unit 220 and is transmitted through the second adjustment unit 230. In view of this, the first adjustment unit 220 and second adjustment unit 230 are arranged with a spacing of ½ or more of the coherence length of a light beam from the light source 10. In this embodiment, the first adjustment unit 220 and second adjustment unit 230 are arranged via the imaging optical system 210 with a spacing of ½ or more of the coherence length of a light beam from the light source 10. Hence, the illumination target surface can be illuminated with a uniform illuminance distribution free from generation of any interference fringes on the illumination target surface. As a result, the exposure apparatus 1 can precisely transfer the pattern of the reticle 30 onto the wafer 50 at a desired line width.

Also, in this embodiment, the adjustment coatings 222 and 232 formed on the first adjustment unit 220 and second adjustment unit 230, respectively, each have a reflectance distribution (transmittance distribution) in which the reflectance (transmittance) monotonically increases or decreases from the center of the effective region or the Y-axis toward the periphery. However, the adjustment coatings 222 and 232 formed on the first adjustment unit 220 and second adjustment unit 230, respectively, can have various reflectance distributions (transmittance distributions). For example, the adjustment coatings 222 and 232 formed on the first adjustment unit 220 and second adjustment unit 230, respectively, may each have an M-shaped reflectance distribution (transmittance distribution) in which the reflectance (transmittance) increases and then decreases from the center of the effective light source toward the periphery. Moreover, the shapes of regions where the adjustment coatings 222 and 232 are formed (i.e., the shapes of the adjustment coatings 222 and 232) are not limited to rectangular shapes, and may be, for example, circular shapes or elliptical shapes. In this manner, the reflectance distributions (transmittance distributions) of the adjustment coatings 222 and 232, and the shapes of the adjustment coatings 222 and 232 need only be arbitrarily selected (set) in accordance with factors associated with adjustment of the incident angle distributions of light beams which impinge on the illumination target surface.

Although the adjustment coatings 222 and 232 having their thicknesses controlled for each position impart predetermined reflectance distributions (predetermined transmittance distributions) to the first adjustment unit 220 and second adjustment unit 230 in this embodiment, the present invention is not limited to this. For example, predetermined reflectance distributions (predetermined transmittance distributions) may be imparted to the first adjustment unit 220 and second adjustment unit 230 using a dot pattern formed from a light-shielding substance such as chromium. In this case, it is necessary to set the size of each dot and the distances between the first adjustment unit 220 and second adjustment unit 230 and the illumination target surface or a plane conjugate to the illumination target surface by taking account of, for example, the influence of transfer of each dot onto the wafer 50 and diffraction at each dot.

Although each of the first adjustment unit 220 and second adjustment unit 230 has its reflectance (transmittance) which varies depending on the incident position of a light beam in this embodiment, the present invention is not limited to this. For example, the same effect as in this embodiment can be obtained even when each of the first adjustment unit 220 and second adjustment unit 230 has its reflectance (transmittance) which varies depending on the incident angle of a light beam.

Figure 9:
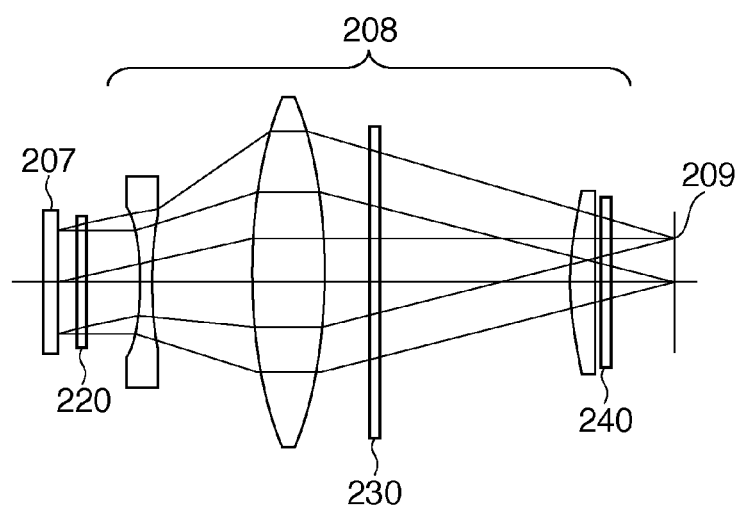
FIG. 9 is a schematic view illustrating an example of the arrangement of the first adjustment unit, the second adjustment unit, and a third adjustment unit in the illumination optical system of the exposure apparatus shown in FIG. 1.

Although two adjustment units, the first adjustment unit 220 and second adjustment unit 230, are used to adjust the incident angle distributions of light beams which impinge on the illumination target surface in this embodiment, the number of adjustment units is not limited to two. For example, as shown in FIG. 9, three adjustment units (the first adjustment unit 220, the second adjustment unit 230, and a third adjustment unit 240) each of which forms a reflectance distribution (transmittance distribution) having its reflectance (transmittance) which varies depending on the incident angle of a light beam may be used. In FIG. 9, the first adjustment unit 220, second adjustment unit 230, and third adjustment unit 240 are arranged in the condenser lens 208 between the optical integrator 207 and the field stop 209. FIG. 9 is a schematic view illustrating an example of the arrangement of the first adjustment unit 220, second adjustment unit 230, and third adjustment unit 240 in the illumination optical system 20.

Figure 10A:
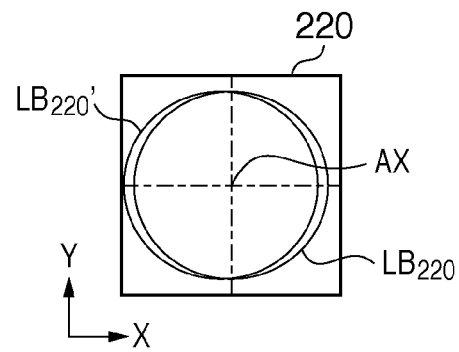
FIGS. 10A to 10C are views showing an on-axis light beam and off-axis light beam which pass through the first adjustment unit, second adjustment unit, and third adjustment unit shown in FIG. 9.
Figure 10B:
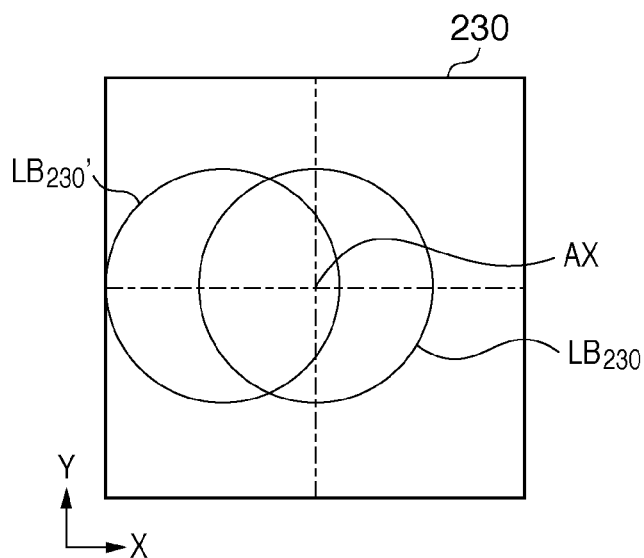
Figure 10C:
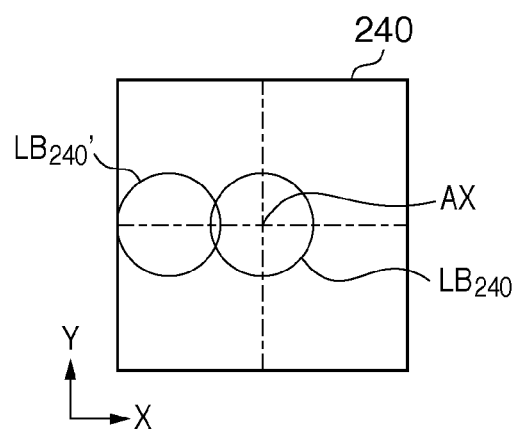

In the arrangement shown in FIG. 9, the first adjustment unit 220, second adjustment unit 230, and third adjustment unit 240 have different regions where an on-axis light beam passes through these adjustment units. That is, as shown in FIGS. 10A to 10C, the first adjustment unit 220, second adjustment unit 230, and third adjustment unit 240 have different pupil divergences $LB_{220}$, $LB_{230}$, and $LB_{240}$ at an on-axis position on the illumination target surface. Similarly, the first adjustment unit 220, second adjustment unit 230, and third adjustment unit 240 also have different regions where an off-axis light beam passes through these adjustment units. That is, as shown in FIGS. 10A to 10C, the first adjustment unit 220, second adjustment unit 230, and third adjustment unit 240 have different pupil divergences $LB_{220}'$, $LB_{230}'$, and $LB_{240}'$ at an off-axis position on the illumination target surface. Note that FIGS. 10A to 10C are views showing an on-axis light beam and off-axis light beam which pass through the first adjustment unit 220, second adjustment unit 230, and third adjustment unit 240.

Also, referring to FIG. 9, because the second adjustment unit 230 and third adjustment unit 240 are relatively close to the field stop 209 placed on a plane conjugate to the illumination target surface, the pupil divergences $LB_{230}$ and $LB_{230}'$ and those $LB_{240}$ and $LB_{240}'$ corresponding to an on-axis position and off-axis position are spaced apart from each other. Hence, the incident angle distributions, in different directions, of the light beams which impinge on the illumination target surface can be independently adjusted by appropriately setting the reflectance distributions (transmittance distributions) of the second adjustment unit 230 and third adjustment unit 240. In this manner, adjustment units which independently adjust the incident angle distributions, in different directions, of the light beams which impinge on the illumination target surface are preferably located near the illumination target surface or near a plane conjugate to it.

In contrast, because the first adjustment unit 220 is close to the optical integrator 207, that is, the pupil plane of the illumination optical system 20, the pupil divergences $LB_{220}$ and $LB_{220}'$ corresponding to an on-axis position and off-axis position nearly match each other. Hence, the first adjustment unit 220 cannot independently adjust the incident angle distributions, in different directions, of the light beams which impinge on the illumination target surface. Instead, because the pupil divergences $LB_{220}$ and $LB_{220}'$ corresponding to an on-axis position and off-axis position nearly match each other, the incident angle distributions, in different directions, of the light beams which impinge on the illumination target surface can be adjusted commonly. In this manner, common asymmetrical components of the incident angle distributions of light beams which impinge on the illumination target surface can be adjusted by locating adjustment units near the pupil plane of the illumination optical system 20.

Under the circumstances, both common components and non-common components of the incident angle distributions can be adjusted by locating adjustment units, which adjust the incident angle distributions of light beams which impinge on the illumination target surface, near the illumination target surface and near the pupil plane of the illumination optical system 20. This, in turn, makes it possible to more accurately (i.e., symmetrically, uniformly) adjust the incident angle distributions of light beams which impinge on the illumination target surface.

Although the first adjustment unit 220 is located near the exit surface of the optical integrator 207 in the arrangement shown in FIG. 9, the present invention is not limited to this. The first adjustment unit 220 may also be located near the incident surface of the optical integrator 207 or near the diffraction pattern surface DPP conjugate to that incident surface.

Also, an adjustment unit located near the pupil plane of the illumination optical system 20 need not always have an adjustment coating which forms a predetermined reflectance distribution, and may be, for example, a stop including a plurality of drivable light-shielding plates as disclosed in Japanese Patent Laid-Open No. 2006-019702.

Although an adjustment unit is configured by forming an adjustment coating on the optical surface of a plane-parallel plate in this embodiment, it may be configured by forming an adjustment coating on the surface of a lens or mirror, that is, on a convex or concave surface. Nevertheless, it is generally easier to form an adjustment coating on a flat surface than to form an adjustment coating on a convex or concave surface, as a matter of course.

Figure 11:
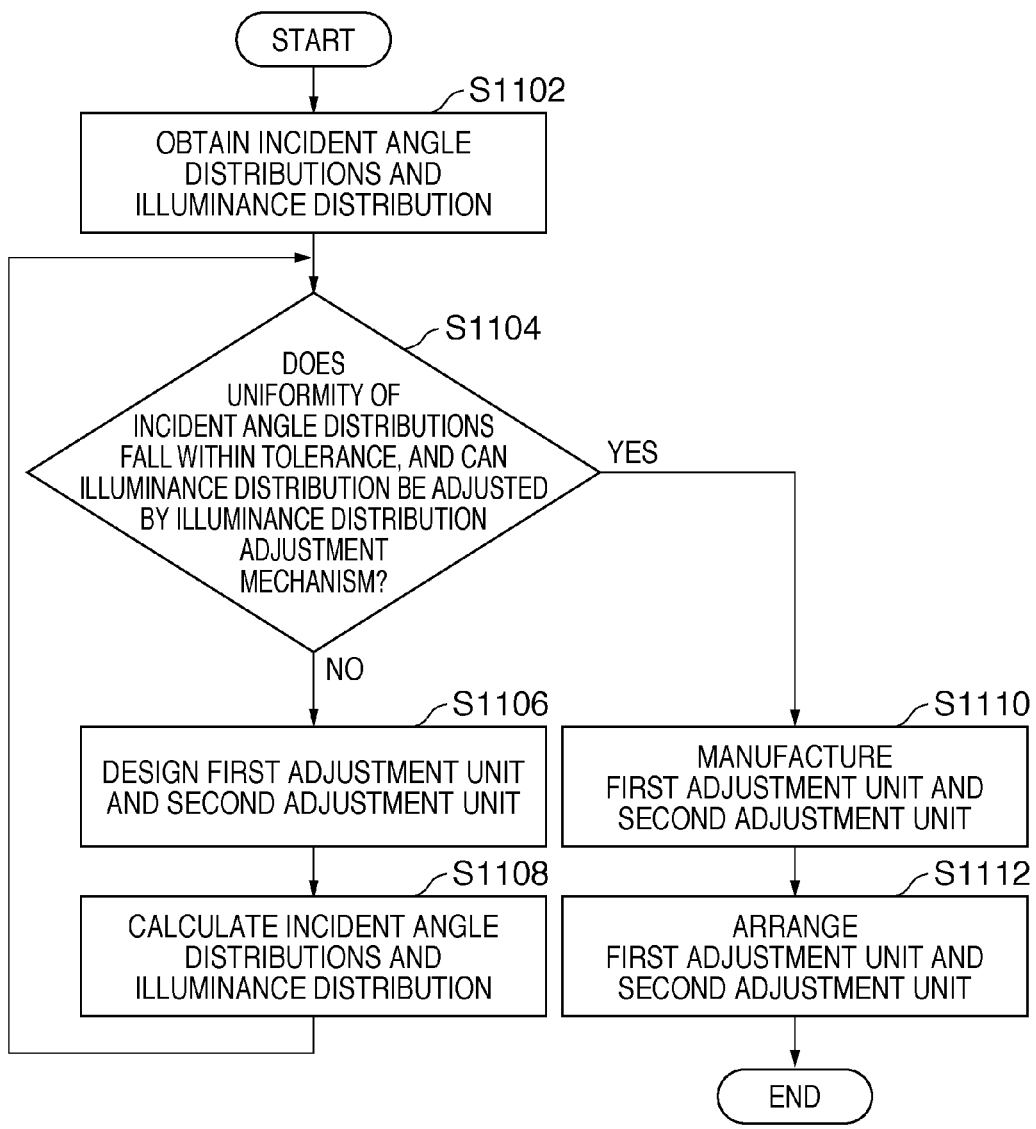
FIG. 11 is a flowchart for explaining a method of adjusting the illumination optical system of the exposure apparatus shown in FIG. 1.

A method of adjusting the illumination optical system 20 and, more specifically, a method of adjusting the first adjustment unit 220 and second adjustment unit 230 will be explained next with reference to FIG. 11.

In step S1102, the incident angle distributions at a plurality of points on the illumination target surface and the illuminance distribution on the illumination target surface are obtained.

The incident angle distributions at a plurality of points on the illumination target surface and the illuminance distribution on the illumination target surface can be calculated by, for example, optical simulation based on design data of the illumination optical system 20. More specifically, data of an optical system (optical components) from the subsequent stage of the optical integrator 207, that is, the pupil plane of the illumination optical system 20 to the illumination target surface is used as design data of the illumination optical system 20. The data of the optical system includes, for example, the radius of curvature of each optical surface, the surface interval, the refractive index and type of a material which forms each optical component, the wavelength of a light beam from the light source 10, the transmittance of each optical component, the transmittance characteristic or reflectance characteristic of an optical coating (e.g., an antireflection coating or a reflection coating) formed on the surface of an optical component.

Figure 12:
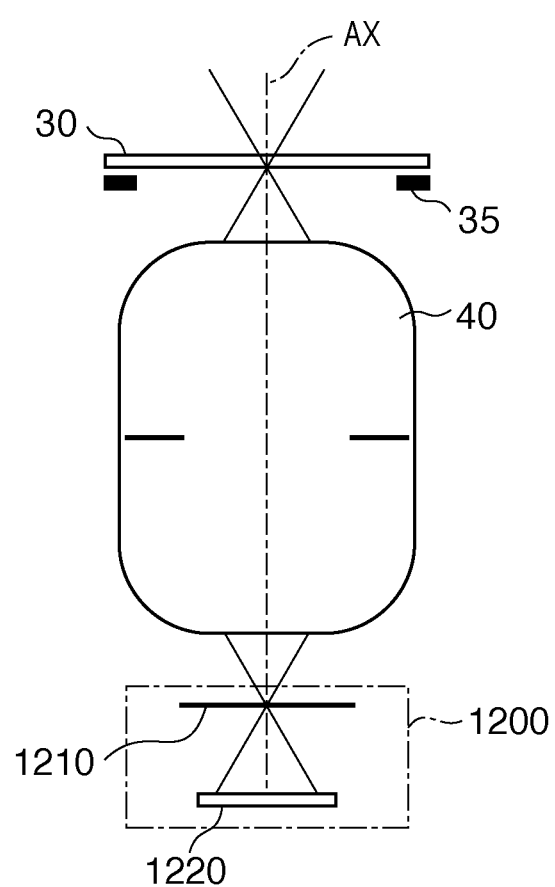
FIG. 12 is a schematic view showing the arrangement of a measurement apparatus for measuring the incident angle distributions at a plurality of points on the illumination target surface.

Alternatively, the incident angle distributions at a plurality of points on the illumination target surface and the illuminance distribution on the illumination target surface may be measured actually. More specifically, the incident angle distributions at a plurality of points on the illumination target surface can be measured using a measurement device 1200 as shown in FIG. 12. The measurement device 1200 is mounted on the wafer stage 55, and includes a pinhole member 1210 and a detection unit 1220 such as a two-dimensional CCD sensor which detects the light beam having passed through the pinhole member 1210. The pinhole member 1210 is positioned at the imaging position of the projection optical system 40, and the detection unit 1220 is positioned with a predetermined distance from the pinhole member 1210. The light beam having passed through the pinhole member 1210 strikes the detection unit 1220 while bearing the information of its angle distribution. The angle distribution of the light beam from the projection optical system 40 reflects a light intensity distribution formed at the position of the aperture stop of the projection optical system 40 (a position conjugate to the pupil plane of the illumination optical system 20), that is, the incident angle distribution on the illumination target surface attributed to the pinhole member 1210. Hence, the incident angle distribution on the illumination target surface attributed to the pinhole member 1210 can be measured by obtaining the angle distribution of the light beam from the light intensity distribution detected by the detection unit 1220. Then, the incident angle distributions at a plurality of points on the illumination target surface can be measured by repeating the measurement while two-dimensionally moving the position of the pinhole member 1210 along a plane perpendicular to the optical axis AX of the illumination optical system 20.

The illuminance distribution on the illumination target surface can be measured using an illuminance measurement device (not shown). The illuminance measurement device is mounted on the wafer stage 55 and includes, for example, a photodiode as a detection unit for measuring the illuminance distribution on the illumination target surface. The illuminance distribution on the illumination target surface can be measured by repeating the measurement while two-dimensionally moving the position of the photodiode along a plane perpendicular to the optical axis AX of the illumination optical system 20. The illuminance measurement device also can measure the illuminance at a plurality of positions on the illumination target surface at once by two-dimensionally or one-dimensionally arranging a plurality of photodiodes. Also, the measurement device 1200 shown in FIG. 12 can be used as an illuminance measurement device. In this case, the sum total of the outputs from a two-dimensional CCD sensor is measured as the illuminance at each position.

In step S1104, it is determined whether the uniformity of the incident angle distributions at a plurality of points on the illumination target surface obtained in step S1102 falls within a tolerance, and the illuminance distribution on the illumination target surface obtained in step S1102 can be adjusted by the illuminance distribution adjustment mechanism. Whether the illuminance distribution can be adjusted by the illuminance distribution adjustment mechanism is determined based on, for example, the characteristics of the illuminance distribution adjustment mechanism, that is, the adjustment characteristic (driving characteristic) and position of the illuminance distribution adjustment mechanism.

If it is determined that the uniformity of the incident angle distributions falls outside the tolerance or the illuminance distribution cannot be adjusted by the illuminance distribution adjustment mechanism, the process advances to step S1106. On the other hand, if it is determined that the uniformity of the incident angle distributions falls within the tolerance and the illuminance distribution can be adjusted by the illuminance distribution adjustment mechanism, the process advances to step S1110.

In step S1106, the first adjustment unit 220 and second adjustment unit 230 which adjust the incident angle distributions in different directions are designed such that the uniformity of the incident angle distributions falls within the tolerance. More specifically, the reflectance distribution (transmittance distribution) and position of the adjustment coating 222 formed on the first adjustment unit 220, and those of the adjustment coating 232 formed on the second adjustment unit 230 are calculated such that the uniformity of the incident angle distributions falls within the tolerance. At this time, the reflectance distributions of the adjustment coatings 222 and 232 are preferably calculated such that the illuminance distribution on the illumination target surface can be adjusted by the illuminance distribution adjustment mechanism. The positions of the first adjustment unit 220 and second adjustment unit 230 are determined by, for example, referring to the incident angle distributions and illuminance distribution obtained in step S1102. The reflectance distributions of the adjustment coatings 222 and 232 for adjustment such that the illuminance distribution on the illumination target surface can be adjusted by the illuminance distribution adjustment mechanism and the uniformity of the incident angle distributions falls within the tolerance are calculated.

In step S1108, the incident angle distributions at a plurality of points on the illumination target surface and the illuminance distribution on the illumination target surface while the first adjustment unit 220 and second adjustment unit 230 designed in step S1106 are arranged are calculated. More specifically, the incident angle distributions at a plurality of points on the illumination target surface and the illuminance distribution on the illumination target surface are calculated using information concerning the positions and reflectance distributions of the first adjustment unit 220 and second adjustment unit 230.

After that, the process returns to step S1104 to determine whether the uniformity of the incident angle distributions at a plurality of points on the illumination target surface calculated in step S1108 falls within the tolerance and the illuminance distribution on the illumination target surface calculated in step S1108 can be adjusted by the illuminance distribution adjustment mechanism. If it is determined that the uniformity of the incident angle distributions falls outside the tolerance or the illuminance distribution cannot be adjusted by the illuminance distribution adjustment mechanism, steps S1106 and S1108 are repeated.

In step S1110, the first adjustment unit 220 and second adjustment unit 230 are manufactured. When, for example, steps S1106 and S1108 are repeated, the first adjustment unit 220 and second adjustment unit 230 are manufactured by determining the thicknesses of adjustment coatings which form the reflectance distributions calculated in step S1106, and forming the adjustment coatings having the determined thicknesses on plane-parallel plates. If YES is determined in step S1104 without performing steps S1106 and S1108 even once before step S1110, plane-parallel plates having no adjustment coatings (having only antireflection coatings formed on them) are used as the first adjustment unit 220 and second adjustment unit 230. The first adjustment unit 220 and second adjustment unit 230 can be easily manufactured as long as adjustment coatings are formed from a single substance while controlling their thicknesses in accordance with the position after antireflection coatings are formed on plane-parallel plates.

In step S1112, the first adjustment unit 220 and second adjustment unit 230 manufactured in step S1110 are arranged in the illumination optical system 20. At this time, the illuminance distribution on the illumination target surface is uniformity adjusted using the illuminance distribution adjustment mechanism as needed.

In this embodiment, the first adjustment unit 220 and second adjustment unit 230 are designed and manufactured in adjusting the illumination optical system 20. However, when the illumination optical system 20 is adjusted after designing and manufacturing, in advance, a plurality of adjustment units having different adjustment positions and different adjustment amounts to adjust the incident angle distributions, optimal adjustment units may be selected from these plurality of adjustment units. In this case, the time taken to adjust the illumination optical system 20 can be greatly shortened because there is no need to design (step S1106) and manufacture (step S1110) the first adjustment unit 220 and second adjustment unit 230.

Exposure of the wafer 50 by the exposure apparatus 1 will be explained next. In exposure, a light beam emitted by the light source 10 illuminates the reticle 30 by the illumination optical system 20. The light which bears the information of the pattern of the reticle 30 forms an image on the wafer 50 by the projection optical system 40. The illumination optical system 20 used for the exposure apparatus 1 can suppress generation of any flare light and accurately (i.e., uniformly) adjust the incident angle distributions on the illumination target surface, as described above. Hence, the exposure apparatus 1 can provide high-quality devices (e.g., a semiconductor device, an LCD device, an image sensing device (e.g., a CCD), and a thin-film magnetic head) with a high throughput and good economical efficiency. These devices are fabricated by a step of exposing a substrate (e.g., a wafer or a glass plate) coated with a photosensitive agent using the exposure apparatus 1, a step of developing the exposed substrate (photosensitive agent), and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-031964 filed on Feb. 13, 2009, which is hereby incorporated by reference herein in its entirety.

What is claimed is:

1. An illumination optical system for illuminating an illumination target surface with a light beam from a light source, the system comprising:
 a field stop configured to define an illumination region on the illumination target surface; and
 a plurality of adjustment units each having one of a reflectance distribution or a transmittance distribution to adjust an incident angle distribution of the light beam impinging on the illumination target surface,
 wherein the plurality of adjustment units includes:
 a first adjustment unit configured to adjust at least one of light amount differences, in a first direction, of incident angle distribution of light incident on the illumination target surface, or light amount differences, in a second direction different from the first direction, thereof; and
 a second adjustment unit configured to adjust differences between light amounts, in the first direction, of incident angle distribution of light incident on the illumination target surface, and light amounts, in the second direction, thereof,
 wherein the first adjustment unit is arranged between the light source and the field stop, and includes an adjustment coating having one of a reflectance distribution or a transmittance distribution in a first region through which a principal ray that enters the illumination region passes, the first region having a reflectance of 1.0% or more, and wherein the second adjustment unit is arranged between the illumination target surface and the field stop, and includes an adjustment coating having one of a reflectance distribution or a transmittance distribution in a region other than a second region through which a principal ray that enters the illumination region passes, the second region not having an adjustment coating and having a reflectance of less than 1.0%.

2. The system according to claim 1, wherein the second direction is a direction perpendicular to the first direction.

3. The system according to claim 1, wherein each of the adjustment coatings has one of a reflectance or a transmittance that varies depending on an incident position of the light beam and is configured to form one of the reflectance distribution or the transmittance distribution.

4. The system according to claim 1, wherein the plurality of adjustment units are arranged with a spacing of not less than ½ of a coherence length of the light beam from the light source.

5. The system according to claim 1, wherein the plurality of adjustment units are located near one of the illumination target surface or a plane conjugate to the illumination target surface.

6. The system according to claim 1, wherein:
the region, of the second adjustment unit, though the principal ray that enters the illumination region passes is a rectangular region, and
the adjustment coating of the second adjustment unit is formed in both sides sandwiching an axis in a longitudinal direction of the rectangular region, and adjusts a light amount distribution, in the first direction, of the incident angle distribution.

7. An exposure apparatus comprising:
an illumination optical system configured to illuminate a reticle with a light beam from a light source; and
a projection optical system configured to project a pattern of the reticle onto a substrate,
wherein the illumination optical system includes:
a field stop configured to define an illumination region on the reticle,
a plurality of adjustment units each having one of a reflectance distribution or a transmittance distribution to adjust an incident angle distribution of the light beam impinging on the reticle, and
wherein the plurality of adjustment units includes:
a first adjustment unit configured to adjust at least one of light amount differences, in a first direction, of incident angle distribution of light incident on the reticle, or light amount differences, in a second direction different from the first direction, thereof, and
a second adjustment unit configured to adjust differences between light amounts, in the first direction, of incident angle distribution of light incident on the reticle, and light amounts, in the second direction, thereof, wherein the first adjustment unit is arranged between the light source and the field stop, and includes an adjustment coating having one of a reflectance distribution or a transmittance distribution in a first region through which a principal ray that enters the illumination region passes, the first region having a reflectance of 1.0% or more, and wherein the second adjustment unit is arranged between the reticle and the field stop, and includes an adjustment coating having one of a reflectance distribution or a transmittance distribution in a region other than a second region through which a principal ray that enters the illumination region passes, the second region not having an adjustment coating and having a reflectance of less than 1.0%.

8. A device fabrication method comprising steps of:
exposing a substrate using an exposure apparatus; and
performing a development process for the exposed substrate,
wherein the exposure apparatus comprises:
an illumination optical system configured to illuminate a reticle with a light beam from a light source; and
a projection optical system configured to project a pattern of the reticle onto the substrate,
wherein the illumination optical system includes:
a field stop configured to define an illumination region on the reticle,
a plurality of adjustment units each having one of a reflectance distribution or a transmittance distribution to adjust an incident angle distribution of the light beam impinging on the reticle, and
wherein the plurality of adjustment units includes:
a first adjustment unit configured to adjust at least one of light amount differences, in a first direction, of incident angle distribution of light incident on the reticle, or light amount differences, in a second direction different from the first direction, thereof, and
a second adjustment unit configured to adjust differences between light amounts, in the first direction, of incident angle distribution of light incident on the reticle, and light amounts, in the second direction, thereof, wherein the first adjustment unit is arranged between the light source and the field stop, and includes an adjustment coating having one of a reflectance distribution or a transmittance distribution in a first region through which a principal ray that enters the illumination region passes, the first region having a reflectance of 1.0% or more, and wherein the second adjustment unit is arranged between the reticle and the field stop, and includes an adjustment coating having one of a reflectance distribution or a transmittance distribution in a region other than a second region through which a principal ray that enters the illumination region passes, the second region not having an adjustment coating and having a reflectance of less than 1.0%.

* * * * *